(12) United States Patent
Dahilig et al.

(10) Patent No.: US 8,174,127 B2
(45) Date of Patent: May 8, 2012

(54) INTEGRATED CIRCUIT PACKAGE SYSTEM EMPLOYING DEVICE STACKING

(75) Inventors: Frederick Rodriguez Dahilig, Singapore (SG); Sheila Marie L. Alvarez, Singapore (SG); Antonio B. Dimaano, Jr., Singapore (SG); Dioscoro A. Merilo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/039,311

(22) Filed: Mar. 3, 2011

(65) Prior Publication Data

US 2011/0147899 A1 Jun. 23, 2011

Related U.S. Application Data

(63) Continuation-in-part of application No. 12/892,941, filed on Sep. 29, 2010, which is a continuation of application No. 11/766,787, filed on Jun. 21, 2007, now Pat. No. 7,830,020.

(51) Int. Cl.
*H01L 23/48* (2006.01)
*H01L 29/41* (2006.01)
*H01L 21/58* (2006.01)
*H01L 21/60* (2006.01)

(52) U.S. Cl. ........ 257/777; 257/678; 257/728; 438/110; 438/119; 438/114; 438/462; 438/109

(58) Field of Classification Search .......... 257/678–743, 257/777; 438/106–108, 110, 113, 114, 460, 438/462, 464, 465
See application file for complete search history.

(56) References Cited

U.S. PATENT DOCUMENTS

| | | |
|---|---|---|
| 6,593,545 B1 | 7/2003 | Greenwood et al. |
| 6,686,664 B2 | 2/2004 | Caletka et al. |
| 6,773,961 B1 | 8/2004 | Lee et al. |
| 7,164,202 B2 | 1/2007 | Wang et al. |
| 7,235,876 B2 | 6/2007 | Okumura et al. |
| 7,309,923 B2 | 12/2007 | Kee |
| 7,569,935 B1 | 8/2009 | Fan |
| 7,683,467 B2 | 3/2010 | Jang et al. |
| 2005/0012212 A1 | 1/2005 | Gilleo |
| 2007/0057367 A1* | 3/2007 | Song et al. ............ 257/723 |
| 2008/0079130 A1 | 4/2008 | Ha et al. |

OTHER PUBLICATIONS

Notice of Allowance for TW Application No. 97119625 dated Dec. 1, 2011.

* cited by examiner

*Primary Examiner* — Telly Green
(74) *Attorney, Agent, or Firm* — Mikio Ishimaru

(57) ABSTRACT

A method of manufacturing an integrated circuit packaging system includes: providing an inner lead and an outer lead, the inner lead having an inner peripheral side with a non-linear contour; forming a bump contact, having a groove in and a mesa from the inner lead or the outer lead, the groove adjacent to the mesa; mounting a first device adjacent to the inner lead; connecting a second device to the mesa; and forming an encapsulation material over the first device, the inner lead, and the outer lead and covering the second device.

20 Claims, 7 Drawing Sheets

INTEGRATED CIRCUIT PACKAGE SYSTEM EMPLOYING DEVICE STACKING

CROSS-REFERENCE TO RELATED APPLICATIONS

This application is a Continuation-in-part of a U.S. patent application Ser. No. 12/892,941 filed Sep. 29, 2010, which is a Continuation of U.S. patent application Ser. No. 11/766,787 filed Jun. 21, 2007, now U.S. Pat. No. 7,830,020, and the subject matter thereof is hereby incorporated herein by reference thereto.

TECHNICAL FIELD

The present invention relates generally to integrated circuits, and more particularly to an integrated circuit package system employing device stacking.

BACKGROUND ART

Integrated circuits and integrated circuit package systems can be found in a multitude of electronic devices, such as cell phones, pocket PCs, digital cameras, automobile engines, and many other portable/wireless products. Today's customers and electronic systems are demanding that these integrated circuit systems provide maximum functional integration of memory and logic within the smallest footprint, lowest profile, and lowest cost package available. Consequently, manufacturer's are turning to three-dimensional packaging to achieve the required high level of functional integration necessary to support these mobile electronic products.

Various techniques have been developed to meet the continued demands for improving functional integration and circuit density within a three-dimensional package. Unfortunately, leadframe based three-dimensional packages have lagged in their ability to handle the increase in circuit density required of high level functionally integrated systems. Typically, leadframe packaging has its limit when providing acceptable solutions for three-dimensional integration due to factors such as, increased package thickness, a larger footprint area, and insufficient input/output leads to handle the higher circuit density.

Thus, a need still remains for a reliable integrated circuit package system and method of fabrication, wherein the integrated circuit package system permits high density three-dimensional device stacking within the same interconnect level. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers are found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing an integrated circuit packaging system includes: providing an inner lead and an outer lead, the inner lead having an inner peripheral side with a non-linear contour; forming a bump contact, having a groove in and a mesa from the inner lead or the outer lead, the groove adjacent to the mesa; mounting a first device adjacent to the inner lead; connecting a second device to the mesa; and forming an encapsulation material over the first device, the inner lead, and the outer lead and covering the second device.

The present invention provides an integrated circuit packaging system, includes: a first device; an outer lead around the first device; an inner lead, having an inner peripheral side with a non-linear contour, adjacent to the first device; a bump contact, having a groove in and a mesa from the inner lead or the outer lead, the groove adjacent to the mesa; a second device connected to the mesa; and an encapsulation material over the first device, the inner lead, and the outer lead and covering the second device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
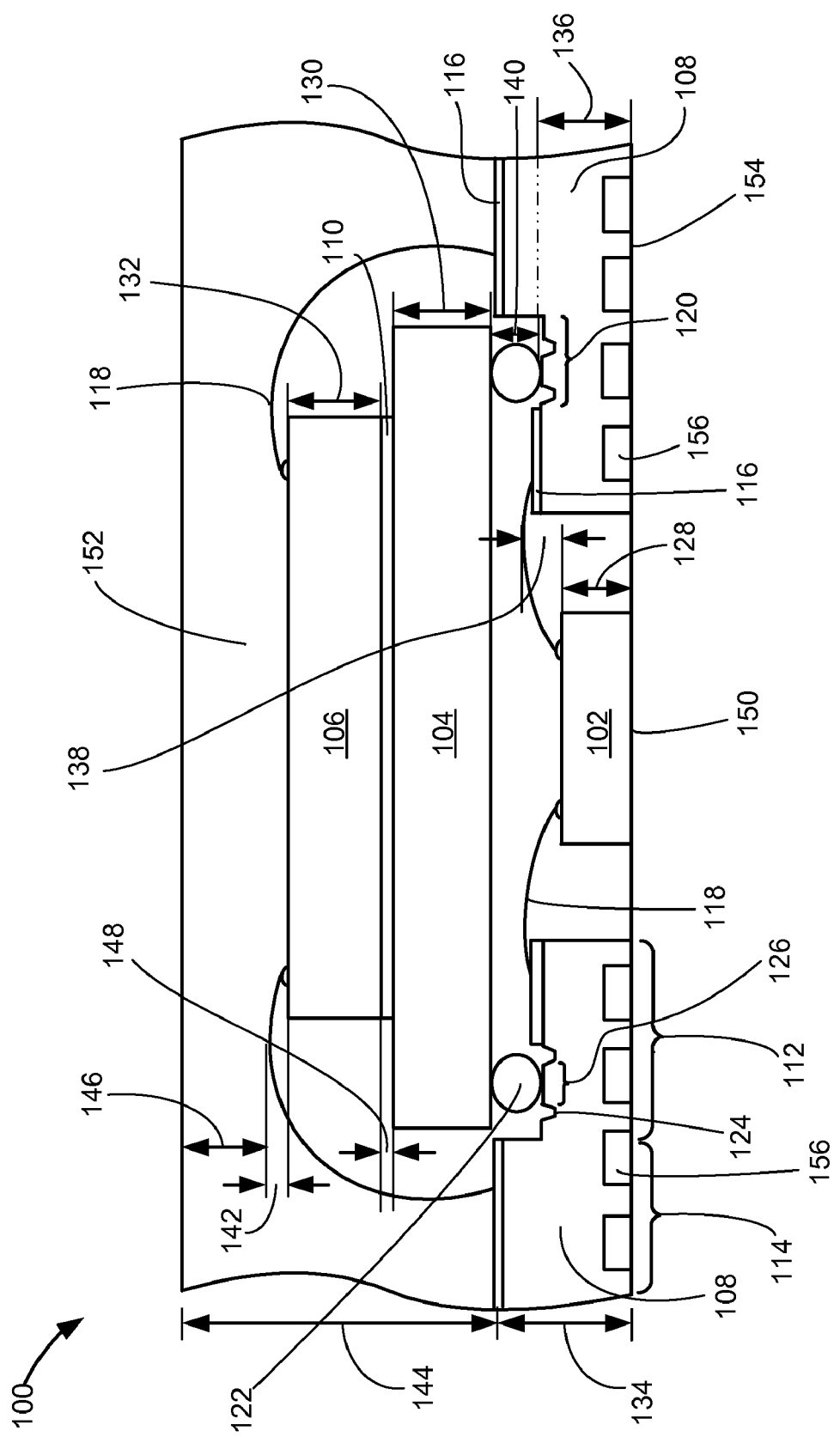
FIG. 1 is a cross-sectional view of an integrated circuit package system in a first embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of an electrical interconnect system, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The terms "processed" or "processing" as used herein includes deposition of material or photoresist, patterning, exposure, development, etching, cleaning, and/or removal of the material or photoresist as required in forming a described structure.

The terms "half-etched", "half-etching", "stamped" or "stamping" as used herein includes removing a portion of an electrical interconnect system in a thickness direction that may be substantially equivalent to half, less than half, or greater than half of the thickness of the electrical interconnect system. However, in no event will "half-etched", "half-etching", "stamped" or "stamping" be defined to include removal of the entire thickness of the electrical interconnect system.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", and "third" as used herein are for purposes of differentiation between elements only and are not to be construed as limiting the scope of the present invention.

Referring now to FIG. 1 therein is shown a cross-sectional view of an integrated circuit package system 100 in a first embodiment of the present invention. As an exemplary illustration, the integrated circuit package system 100 may generally be used within a portable electronic device that requires a high level of functional integration, such as a cell phone or computer.

The integrated circuit package system 100 includes a first device 102, a second device 104 and a third device 106 stacked between and/or over an electrical interconnect system 108. By way of example, each of the first device 102, the second device 104 and the third device 106 may include semiconductor chips and integrated circuit packages selected from active components, passive components, processor components, memory components, logic components, digital components, analog components, power components, and so forth, in numerous configurations and arrangements as may be needed. As exemplary illustrations, each of the first device 102, the second device 104 and the third device 106 may more specifically include a digital signal processor, an application specific integrated circuit, a flip-chip configuration, a graphical processor unit, flash memory, dynamic random access memory (DRAM), magnetic random access memory (MRAM), static random access memory (SRAM), an optical sensor device, a micro-electro-mechanical device, a radio frequency (RF) device, and/or a combination thereof.

Furthermore, it is to be understood that each of the first device 102, the second device 104 and the third device 106 may also include Package-in-Package (PiP) and Package-on-Package (PoP) configurations. The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board and/or electrical interconnect mount process.

In accordance with the present invention each of the first device 102, the second device 104 and the third device 106 covers a wide range of semiconductor chip and integrated circuit package configurations involving various types, sizes, dimensions, and electrical contact techniques, and the kind of chip or package configuration employed should only be limited by the design specifications of the integrated circuit package system 100.

An inter-device structure 110 may separate the second device 104 and the third device 106. The inter-device structure 110 may include an adhesive with or without thermally conducting capabilities, a spacer, an electromagnetic interference shield for blocking potentially disruptive energy fields, or a combination thereof. For example, if the inter-device structure 110 is an adhesive layer, the adhesive layer may include a film or a partially unconsolidated (e.g.—a liquid or a gel) adhesive material, which allows the third device 106 to self-align over the second device 104. Furthermore, if the inter-device structure 110 is an adhesive layer, the adhesive layer can be deposited in any pattern or shape (e.g.—a zero fillet configuration), which facilitates the adhesion of the third device 106 to the second device 104.

The electrical interconnect system 108 may include a lead-finger system defined by an inner lead-finger system 112 and an outer lead-finger system 114. The outer lead-finger system 114 is typically formed integrally with the inner lead-finger system 112 and the outer lead-finger system 114 may extend from the package body for establishing an external electrical connection. For purposes of illustration, the electrical interconnect system 108 can be made from a conducting material such as copper.

By way of example, the electrical interconnect system 108 may include a thin metal sheet, a conductive plated pattern on plastic tape, or any structure suitable for supporting and/or electrically interconnecting the first device 102, the second device 104, and the third device 106 to external electrical circuits. For purposes of illustration, the electrical interconnect system 108 can be exemplified by a leadframe with a lead-finger system including single in-line leads, dual in-line leads, quad flat pack leads, gull-wing leads, j-leads, leadless leads that wrap around the package edge to maintain a low profile, pin grid array leads, or ball grid array leads. However, it is to be understood that the present invention is not to be limited to these examples. In accordance with the present invention, the electrical interconnect system 108 may include any electrical interconnection structure (i.e.—leads) that facilitates the incorporation of the integrated circuit package system 100 into a higher-level assembly, such as a printed circuit board or other suitable structure for supporting the integrated circuit package system 100.

In an aspect of a preferred embodiment, the electrical interconnect system 108 may include a single row or dual row lead/land configuration that has been half-etched or stamped. More specifically, the electrical interconnect system 108 may include a single row or dual row lead/land configuration, wherein the inner lead-finger system 112 has been half-etched or stamped for purposes of subsequently forming a wire bond contact 116 and a bump contact 120.

The wire bond contact 116 can be used for electrically interconnecting each of the first device 102 and the third device 106 to external electrical circuits through the electrical interconnect system 108. The wire bond contact 116 may include a region pre-plated with, but not limited to, nickel, palladium, lead, tin, gold, and alloys thereof. By way of example, the wire bond contact 116 can be electrically attached to the first device 102 and the third device 106 by a wire bond 118. The wire bond 118 can be deposited using materials and techniques well known within the art and is currently only limited by the technology of wire bond equipment and the minimum required operating space.

The bump contact 120 can be used for electrically interconnecting the second device 104 to external electrical circuits through the electrical interconnect system 108. By way of example, the bump contact 120 can be electrically attached to the second device 104 by a bump bond 122. Notably, the bump contact 120 of the present invention includes a groove 124 formed adjacent a mesa 126. In an aspect of a preferred embodiment, the mesa 126 can be defined by the groove 124, as the depth of the groove 124 is substantially equal to the height of the mesa 126.

Although, the present embodiment depicts the groove 124 formed on opposing sides of the mesa 126, it is to be understood that the groove 124 may be formed on one or more sides of the mesa 126 or continuously around the mesa 126. Further, it is to be understood that one or more of the groove 124 may be formed per side of the mesa 126. Moreover, the groove 124 may include any design or shape, such as circular, triangular, or rectangular, for example. Furthermore, the depth of the groove 124 is not to be limited to the height of the mesa 126 and may include any depth that helps to minimize electrical shorting occurrences.

Those skilled in the art will recognize that the mesa 126 can be configured to receive the bump bond 122 and that the groove 124 can be designed to accommodate excess solder that flows off of the mesa 126 during reflow, thereby helping to prevent electrical shorts caused by the migration of excess solder. Furthermore, it is to be understood that the groove 124 and the mesa 126 may further include a combination of solder wettable and solder non-wettable regions configured and engineered to reduce the occurrence of electrical shorts from excess solder.

Hereinafter, exemplary package dimensions are provided for the integrated circuit package system 100, however, it is to be understood that these dimensions are provided merely for purposes of illustration and are not to be construed as limiting the scope of the present invention or the claims appended hereto. By way of example, the integrated circuit package system 100 may possess the following dimensions: a first device thickness 128 of about 0.1 millimeters; a second device thickness 130 of about 0.15 millimeters; a third device thickness 132 of about 0.1 to about 0.15 millimeters; an outer lead-finger system thickness 134 of about 0.2 millimeters; an inner lead-finger system thickness 136 of about 0.15 millimeters; a first device loop height 138 of about 0.075 millimeters; a second device bump height 140 of about 0.1 millimeters; a third device loop height 142 of about 0.15 millimeters; a mold cap height 144 of about 0.65 millimeters; a mold cap clearance height 146 of about 0.1 millimeters; and an inter-device structure height 148 of about 0.01 to about 0.05 millimeters.

Notably, the electrical interconnect system 108 of the integrated circuit package system 100 does not include a paddle. By eliminating the need for a paddle, the profile of the integrated circuit package system 100 is greatly reduced. However, it is to be understood that the scope of the present invention may include the use of a paddle for purposes of structural stability, for example.

Moreover, the profile of the integrated circuit package system 100 can be further reduced by employing thin and ultra-thin devices for the first device 102, the second device 104, and the third device 106. Through the use of thin and ultra-thin devices, the integrated circuit package system 100 may achieve a package height of about one millimeter or less, even when employing similarly sized devices or differently sized devices for the second device 104 and the third device 106. Notably, this reduced profile package design of the integrated circuit package system 100 naturally improves the thermal dissipation ability of the integrated circuit package system 100 because the heat flux of a solid object is inversely proportional to the thickness of the object, noting Fourier's law of heat conduction in solids.

Additionally, the present invention further enhances the thermal dissipation ability of the integrated circuit package system 100 by exposing a first device backside 150 to an external environment. This improved thermal dissipation ability can be further enhanced by attaching a thermally conductive substrate or a heat sink adjacent the first device backside 150. By improving the ability of the integrated circuit package system 100 to dissipate heat, the reliability and the useful life of the integrated circuit package system 100 can be improved.

Moreover, it is to be understood that standard packages or devices may be used for the first device 102, the second device 104, and the third device 106, thereby reducing the cost of manufacturing the integrated circuit package system 100.

Another notable aspect of the present invention is that it allows for testing of the first device 102, the second device 104 and the third device 106 before adhering them to the electrical interconnect system 108, therefore ensuring the use of known good die or packages in the manufacturing process. Additionally, after adhering the first device 102, the second device 104, and the third device 106 to the electrical interconnect system 108, these assemblies can also be tested before incorporation into additional package systems. This ensures that the final product includes known good assemblies, and thereby improves the manufacturing process yield for packaging.

An encapsulation material 152, such as a plastic molding compound, is deposited over the integrated circuit package system 100. Notably, the encapsulation material 152 does not cover at least a portion of an electrical interconnect system bottom side 154 and at least a portion of the first device backside 150. By leaving the electrical interconnect system bottom side 154 and the first device backside 150 exposed to the external environment, the ability of the integrated circuit package system 100 to dissipate heat is greatly improved. Furthermore, by exposing the electrical interconnect system bottom side 154, the integrated circuit package system 100 may optionally include an electrical contact 156 for permitting a higher density concentration of input/output leads.

Moreover, the encapsulation material 152 not only protects the integrated circuit package system 100 from the external environment but it may also provide overall structural support and stability to the integrated circuit package system 100. The encapsulation material 152 and molding techniques using it are well known in the art and not repeated herein.

FIGS. 2-8, which follow, depict by way of example and not by limitation, an exemplary process flow for the formation of the integrated circuit package system 100, of FIG. 1, and they are not to be construed as limiting. Accordingly, it is to be understood that many modifications, additions, and/or omissions may be made to the below described process flow without departing from the scope or spirit of the claimed subject matter. For example, the process may include more, fewer, or other steps. Additionally, since the structure and elements of FIGS. 2-8 are the same as the structure and elements of FIG. 1, identical numerals have been used and explanations thereof are omitted.

Although FIGS. 2-8 depict the formation of one of the integrated circuit package system 100, it is to be understood that one or more of the integrated circuit package system 100 can be prepared at one time on a support structure, which could then be separated into individual or multiple semiconductor assemblies at a later stage of fabrication.

Figure 2:
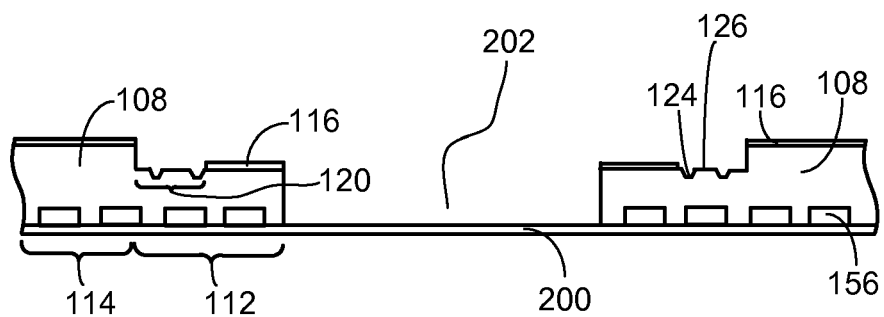
FIG. 2 is a cross-sectional view of the integrated circuit package system, of FIG. 1, in an initial stage of manufacture, in accordance with an embodiment of the present invention.

Referring now to FIG. 2, therein is shown a cross-sectional view of the integrated circuit package system 100, of FIG. 1, in an initial stage of manufacture, in accordance with an embodiment of the present invention. The electrical interconnect system 108 includes the inner lead-finger system 112, the outer lead-finger system 114, the wire bond contact 116, the bump contact 120, the groove 124, the mesa 126, and the electrical contact 156.

This cross-sectional view depicts attaching the electrical interconnect system 108 to a support medium 200, such as a tape that is part of a tape and reel configuration, for example. However, it is to be understood that the support medium 200 is not limited to the preceding example and the support medium 200 may include any structure that helps to support the electrical interconnect system 108 during manufacture.

An opening 202 is provided within the electrical interconnect system 108. The opening 202 provides a recess for the subsequent placement of the first device 102, of FIG. 1, between portions of the inner lead-finger system 112. Generally, the perimeter or dimensions of the opening 202 are defined by the inner lead-finger system 112. It is to be understood that the dimensions of the opening 202 can be minimized to help reduce the overall footprint of the integrated circuit package system 100 or the dimensions of the opening 202 can be made larger to help reduce per unit product costs, for example.

By way of example, the opening 202 can be formed within the electrical interconnect system 108 by punching or etching.

Figure 3:
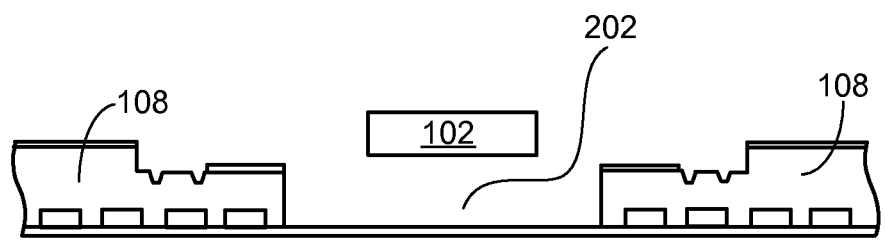
FIG. 3 is the structure of FIG. 2 during placement of a first device.

Referring now to FIG. 3, therein is shown the structure of FIG. 2 during placement of a first device 102. Per this embodiment, the first device 102 is centrally aligned within the opening 202 of the electrical interconnect system 108.

Figure 4:
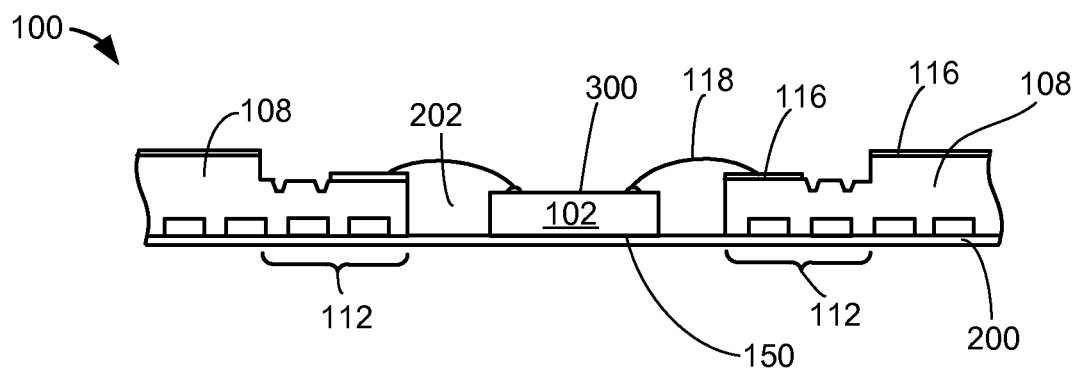
FIG. 4 is the structure of FIG. 3 after attachment of the first device and formation of a wire bond.

Referring now to FIG. 4, therein is shown the structure of FIG. 3 after attachment of the first device 102 and formation of the wire bond 118. Per this embodiment, the first device 102 is attached to the support medium 200 and the wire bond 118 is formed. Generally, the placement or location of the first device 102 can be described as between the inner lead-finger system 112.

Notably, the surface of the electrical interconnect system 108 attached to the support medium 200 is substantially coplanar with the first device backside 150. By allowing the first device 102 to be mounted within the opening 202 of the electrical interconnect system 108, the overall dimensions of the integrated circuit package system 100 may be reduced by utilizing the thickness of the electrical interconnect system 108 to accommodate the first device 102.

A first device active side 300 has been left exposed for further processing steps, such as wire bonding. Notably, the wire bond 118 between the first device 102 and the wire bond contact 116 of the inner lead-finger system 112 can exhibit a low loop height due to the half-etch profile employed on the inner lead-finger system 112.

Figure 5:
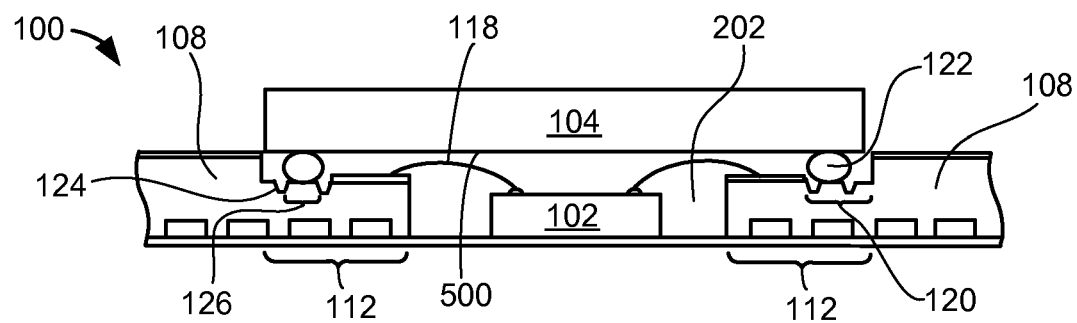
FIG. 5 is the structure of FIG. 4 after placement of a second device.

Referring now to FIG. 5, therein is shown the structure of FIG. 4 after placement of a second device 104. Per this embodiment, the second device 104, which may include a flip-chip device, is formed over the first device 102, the opening 202, and the inner lead-finger system 112. The second device 104 is electrically attached to the bump contact 120 via the bump bond 122. Preferably, the bump bond 122 should possess a height sufficient to provide clearance between a second device bottom side 500 and the wire bond 118 of the first device 102.

During attachment, the bump bond 122 of the second device 104 is aligned over the bump contact 120. More specifically, the bump bond 122 can be aligned over and electrically connected to the mesa 126 by targeting the mesa 126; or, the bump bond 122 can be aligned over and electrically connected to the mesa 126 by targeting the bump bond 122 placement between each of the groove 124. Notably, by forming the second device 104 over the inner lead-finger system 112, the overall profile or height of the integrated circuit package system 100 can be reduced by utilizing the reduced thickness portion of the electrical interconnect system 108.

Figure 6:
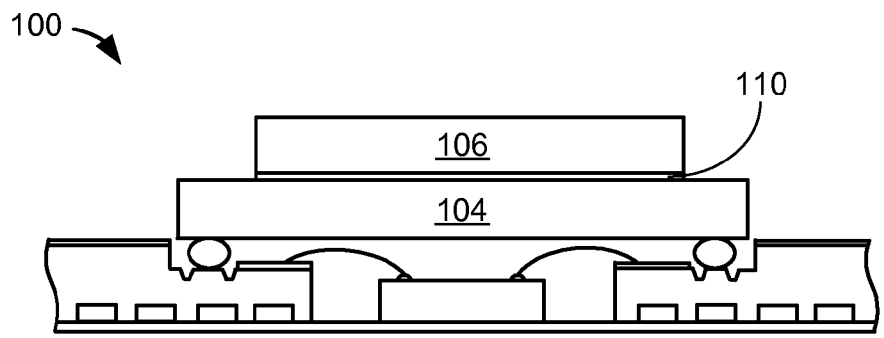
FIG. 6 is the structure of FIG. 5 after placement of a third device.

Referring now to FIG. 6, therein is shown the structure of FIG. 5 after placement of a third device 106. The third device 106 is aligned over and attached to the second device 104 via the inter-device structure 110 (i.e.—the inter-device structure 110 is formed between the second device 104 and the third device 106). Although the third device 106 is depicted as smaller in size than the second device 104, it is to be understood that the third device 106 may be the same size or even slightly larger than the second device 104 to maximize the circuit density within the integrated circuit package system 100.

Figure 7:
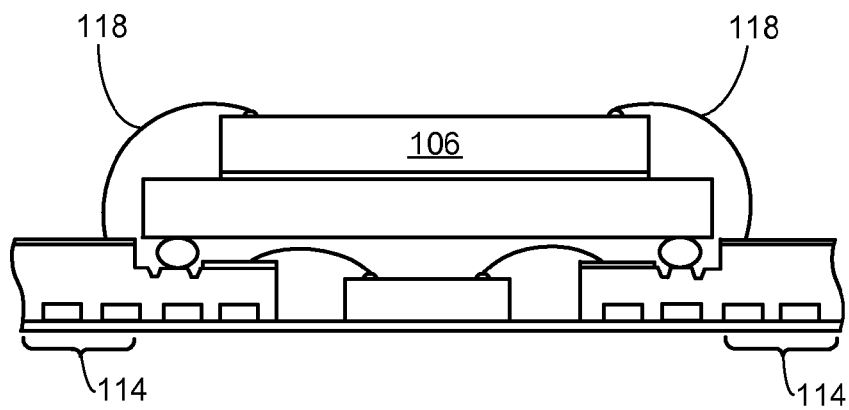
FIG. 7 is the structure of FIG. 6 after formation of a wire bond.

Referring now to FIG. 7, therein is shown the structure of FIG. 6 after formation of a wire bond 118. The wire bond 118 is formed between the third device 106 and the outer lead-finger system 114.

Figure 8:
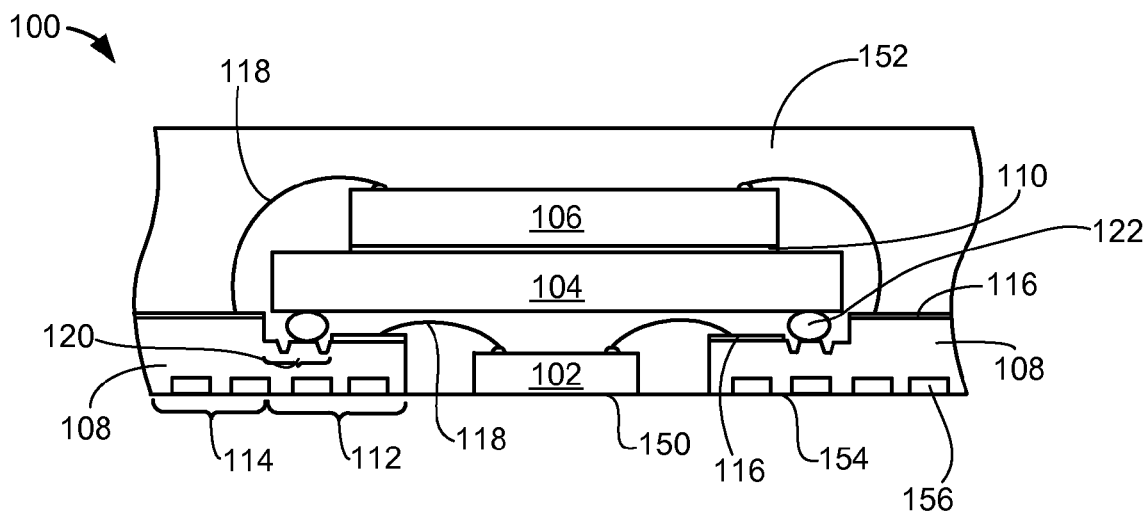
FIG. 8 is the structure of FIG. 7 after formation of an encapsulation material.

Referring now to FIG. 8, therein is shown the structure of FIG. 7 after formation of an encapsulation material 152. The encapsulation material 152 covers the first device 102, the second device 104, the third device 106, the electrical interconnect system 108, the inter-device structure 110, the inner lead-finger system 112, the outer lead-finger system 114, the wire bond 118, the bump bond 122, and portions of the wire bond contact 116 and the bump contact 120. Notably, due to the support medium 200, of FIG. 7, this molding process leaves the first device backside 150 and the electrical interconnect system bottom side 154 exposed after removal of the support medium 200.

After removal of the support medium 200 the integrated circuit package system 100 can be singulated from the electrical interconnect system 108 along tie bar removal lines (not shown). After singulation, the integrated circuit package system 100 will exhibit or possess the characteristics of singulation along its peripheral edges. The characteristics of singulation may include physical features, such as micro-abrasions, which are indicative of a lasing or mechanical dicing process.

Additionally, before or after singulation, a post mold cure process can be performed to strengthen the encapsulation material 152. Moreover, if desired, the electrical contact 156 formed on the electrical interconnect system bottom side 154 may undergo an optional plating process for improved conductivity and bonding.

Figure 9:
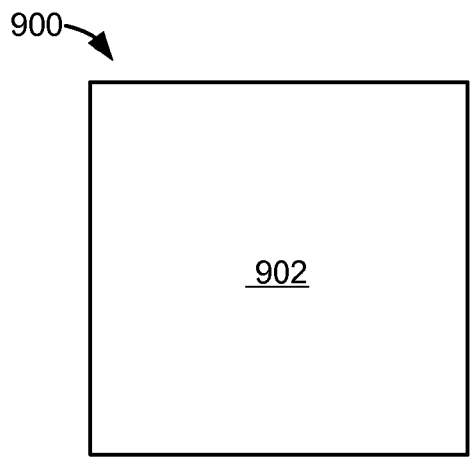
FIG. 9 is a top view of an integrated circuit packaging system in a second embodiment of the present invention.

Referring now to FIG. 9, therein is shown a top view of an integrated circuit packaging system 900 in a second embodiment of the present invention. The top view depicts an encapsulation material 902, which is a package cover that can be made out of an epoxy molding compound.

For illustrative purposes, the encapsulation material 902 is shown having a square geometric shape, although it is understood that the encapsulation material 902 can have a different shape. For example, the encapsulation material 902 can have a rectangular geometric shape or a square shape with rounded or angled corners.

Figure 10:
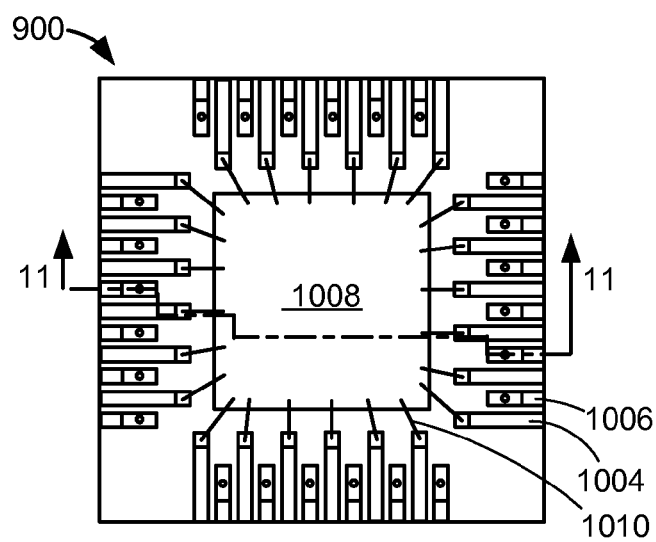
FIG. 10 is a top plan view of the integrated circuit packaging system without a top portion of the encapsulation material.

Referring now to FIG. 10, therein is shown a top plan view of the integrated circuit packaging system 900 without a top portion of the encapsulation material 902. The top plan view depicts rows of inner leads 1004 and outer leads 1006. The inner leads 1004 and outer leads 1006 are conductive structures, which can be made out of a conductive material, such as copper, a copper alloy, or other conductive alloys.

The inner leads 1004 and outer leads 1006 can be arranged in a staggered configuration around a first device 1008, which is a semiconductor device with active circuitry fabricated thereon. As an example, the first device 1008 can be an integrated circuit die, a flip chip, a thin integrated circuit, or an ultra-thin integrated circuit. The end of the inner leads 1004 facing the first device 1008 can be closer to the first device 1008 than the end of the outer leads 1006 facing the first device 1008.

The first device 1008 can be connected to the inner leads 1004 with wire bonds 1010, which are electrical connectors. As an example, the wire bonds can be a bond wire or a ribbon bond wire.

Figure 11:
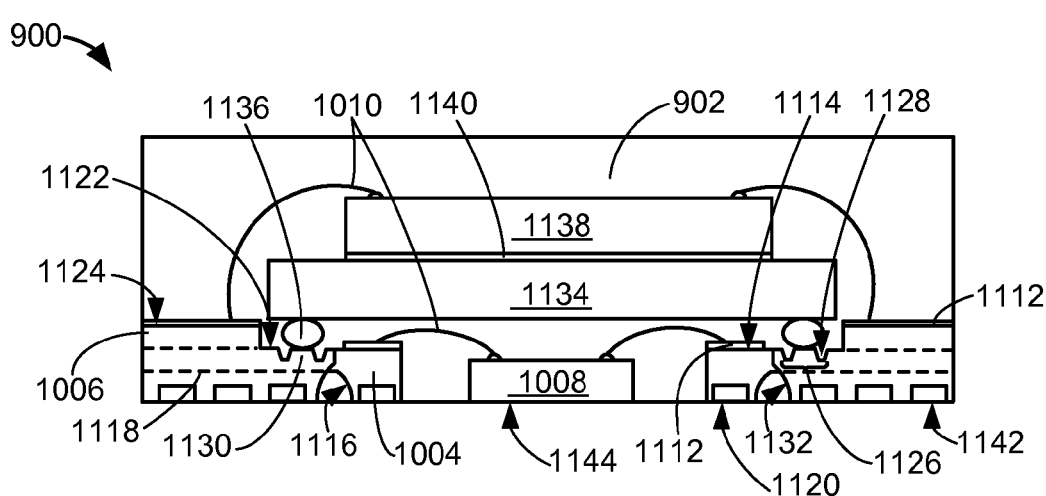
FIG. 11 is a cross-sectional view of the integrated circuit packaging system along line 11-11 of FIG. 10.

Referring now to FIG. 11, therein is shown a cross-sectional view of the integrated circuit packaging system 900 along line 11-11 of FIG. 10. The cross-sectional view depicts the inner leads 1004 with wire bond contacts 1112, which is a plating made out of conductive material, such as gold, silver, or other conductive metals, over an inner top side 1114 of the inner leads 1004. The wire bond contacts 1112 can be over a portion of an inner top side 1114 nearest to the first device 1008.

The first device 1008 can be adjacent to and between the inner leads 1004. The first device 1008 can be connected to the inner leads 1004 with the wire bonds 1010. The wire bonds 1010 can connect the wire bond contacts 1112 over the inner leads 1004 and a top side of the first device 1008.

The inner leads 1004 can have an inner peripheral side 1116 that is non-linear. The inner peripheral side 1116 that is non-linear can be the side of the inner leads 1004 that is facing away for the first device 1008. As an example, the inner peripheral side 1116 is shown having a curved contour.

The inner leads 1004 can have an inner half-etched portion 1118. The inner half-etched portion 1118 can be formed along an inner bottom side 1120 of the inner leads 1004. The inner half-etched portion 1118 can extend from the inner peripheral side 1116. The inner half-etched portion 1118 can extend away from the side of the inner leads 1004 facing the first device 1008, as depicted by the dashed lines.

The inner half-etched portion 1118 can be formed in a number of different ways. For example, the inner half-etched portion 1118 can be formed by a process, such as chemical etching or mechanical grinding.

The outer leads 1006 can have a lower top side 1122 and an upper top side 1124. The lower top side 1122 can be at a lower position of the outer leads 1006 than the upper top side 1124. The lower top side 1122 is depicted as a step down portion of the outer leads 1006 compared to the upper top side 1124. The lower top side 1122 can be over a portion of the outer leads 1006 that is closer to the first device 1008.

The upper top side 1124 can be over a portion of the outer leads 1006 that is further away from the first device 1008. The wire bond contacts 1112 can be over the upper top side 1124.

A bump contact 1126 can be along the lower top side 1122 of the outer leads 1006. The bump contact 1126 can include a groove 1128 formed adjacent a mesa 1130. The mesa 1130 can be defined by the groove 1128, as the depth of the groove 1128 is substantially equal to the height of the mesa 1130.

For illustrative purposes, the integrated circuit packaging system 900 is shown having the groove 1128 formed on opposing sides of the mesa 1130, although it is understood that the groove 1128 can be formed differently. For example, the groove 1128 can be formed on one or more sides of the mesa 1130 or continuously around the mesa 1130. As a further example, one or more of the groove 1128 may be formed per side of the mesa 1130. In another example, the groove 1128 may include any design or shape, such as circular, triangular, or rectangular, for example. In yet another example, the depth of the groove 1128 is not to be limited to the height of the mesa 1130 and may include any depth that helps to minimize electrical shorting occurrences.

The outer leads can have an outer peripheral side 1132 that is non-linear. The outer peripheral side 1132 can be the side of the outer leads 1006 that is facing the first device 1008. As an example, the outer peripheral side 1132 is shown having a curved contour.

A second device 1134, which is a semiconductor device with active circuitry fabricated thereon, can be over the inner leads 1004 and the outer leads 1006. As an example, the second device 1134 can be an integrated circuit, a flip chip, or an integrated circuit die. The second device 1134 can be connected to the mesa 1130 of the bump contact 1126 with a bump bond 1136, which is an electrical connector. As an example, the bump bond 1136 can be a solder ball, solder post, a conductive bump or a conductive post.

A third device 1138, which is a semiconductor device having active circuitry fabricated thereon, can be mounted over the second device 1134. As an example, the third device 1138 can be an integrated circuit, a flip chip, or an integrated circuit die. The wire bonds 1010 can connect the third device 1138 and the wire bond contacts 1112 along the upper top side 1124 of the outer leads 1006.

An inter-device structure 1140 may separate the second device 1134 and the third device 1138. The inter-device structure 1140 may include an adhesive with or without thermally conducting capabilities, a spacer, an electromagnetic interference shield for blocking potentially disruptive energy fields, or a combination thereof. For example, if the inter-device structure 1140 is an adhesive layer, the adhesive layer may include a film or a partially unconsolidated (e.g.—a liquid or a gel) adhesive material, which allows the third device 1138 to self-align over the second device 1134. Furthermore, if the inter-device structure 1140 is an adhesive layer, the adhesive layer can be deposited in any pattern or shape (e.g.—a zero fillet configuration), which facilitates the adhesion of the third device 1138 to the second device 1134.

The encapsulation material 902 can be over the first device 1008, the inner leads 1004 and the outer leads 1006. The encapsulation material 902 can cover the second device 1134, the third device 1138, the wire bonds 1010 and the bump bond 1136. The inner leads 1004, the outer leads 1006 and the first device 1008 can be exposed from the encapsulation material 902 along the inner bottom side 1120, an outer bottom side 1142 and a first bottom side 1144 of the first device 1008, respectively.

The encapsulation material 902 can surround the length of the inner leads 1004 that has the inner half-etched portion 1118. The inner half-etched portion 1118 can form a mold interlock feature with the encapsulation material. The mold interlock can function to lock the inner leads 1004 in place and mitigate or eliminate delamination.

It has been discovered that the present invention provides an integrated circuit packaging system 900 having improved connectivity and reliability. The bump contact 1136 having the groove 1128 can accommodate excess solder that flows off of the mesa 1130 during reflow, thereby helping to prevent electrical shorts caused by the migration of excess solder. Thus, connecting the second device 1134 to the mesa 1130 with the bump bond 1136 can improve connectivity and reliability by mitigating or eliminating the risk of electrical shorting with other connections.

It has also been discovered that the present invention provides an integrated circuit packaging system 900 having improved reliability and yield. The inner half-etched portion 1118 of the inner leads 1004 forms a mold interlock feature with the encapsulation material 902. The mold interlock can function to lock the inner leads 1004 in place and mitigate or eliminate delamination, thus increasing reliability and yield of the integrated circuit packaging system 900.

Figure 12:
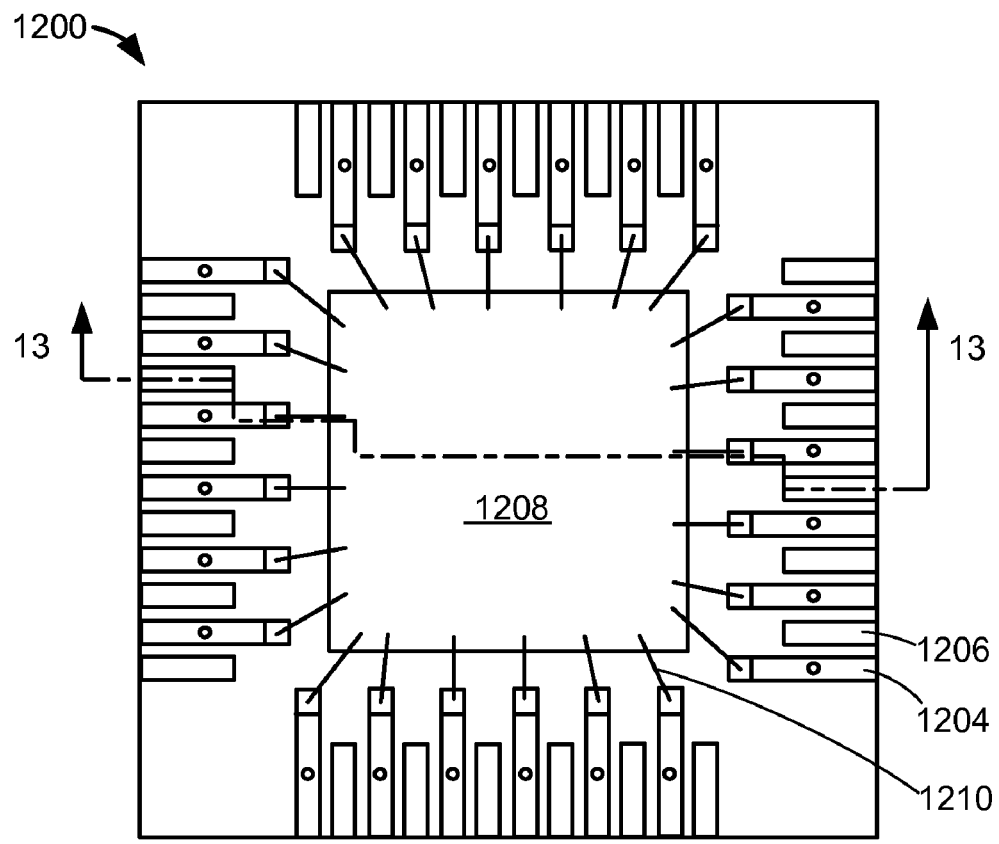
FIG. 12 is a top plan view of an integrated circuit packaging system in a third embodiment of the present invention.

Referring now to FIG. 12, therein is shown a top plan view of an integrated circuit packaging system 1200 in a third embodiment of the present invention. The top plan view depicts rows of inner leads 1204 and outer leads 1206. The inner leads 1204 and outer leads 1206 are conductive structures, which can be made out of a conductive material, such as copper, a copper alloy, or other conductive alloys.

The inner leads 1204 and outer leads 1206 can be arranged in a staggered configuration around a first device 1208, which is a semi-conductor device with active circuitry fabricated thereon. As an example, the first device 1208 can be an integrated circuit die, a flip chip, a thin integrated circuit, or an ultra-thin integrated circuit. The end of the inner leads 1204 facing the first device 1208 can be closer to the first device 1208 than the end of the outer leads 1206 facing the first device 1208.

Figure 13:
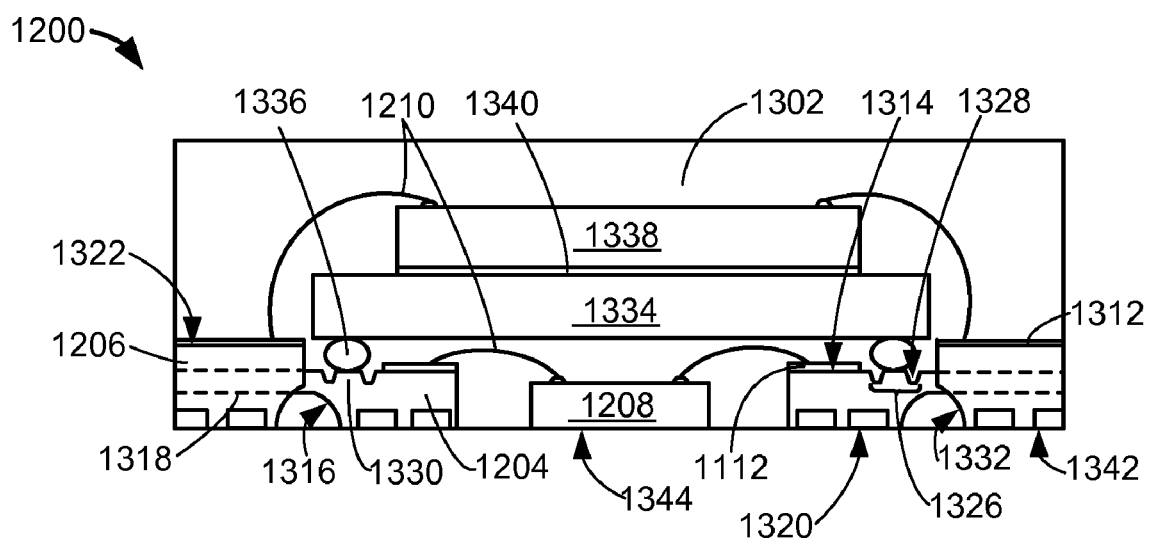
FIG. 13 is a cross-sectional view of the integrated circuit packaging system along line 13-13 of FIG. 12.

Referring now to FIG. 13, therein is shown a cross-sectional view of the integrated circuit packaging system 1200 along line 13-13 of FIG. 12. The cross-sectional view depicts the inner leads 1204 with wire bond contacts 1312, which is a plating made out of conductive material, such as gold, silver, or other conductive metals, over an inner top side 1314 of the inner leads 1204. The wire bond contacts 1312 can be over a portion of an inner top side 1314 nearest to the first device 1208.

The first device 1208 can be adjacent to and between the inner leads 1204. The first device 1208 can be connected to the inner leads 1204 with the wire bonds 1210. The wire bonds 1210 can connect the wire bond contacts 1312 over the inner leads 1204 and a top side of the first device 1208.

A bump contact 1326 can be adjacent to the wire bond contacts 1312 along the inner top side 1314 of the inner leads 1204. The bump contact 1326 can include a groove 1328 formed adjacent a mesa 1330. The mesa 1330 can be defined by the groove 1328, as the depth of the groove 1328 is substantially equal to the height of the mesa 1330.

For illustrative purposes, the integrated circuit packaging system 1200 is shown having the groove 1328 formed on opposing sides of the mesa 1330, although it is understood that the groove 1328 can be formed differently. For example, the groove 1328 can be formed on one or more sides of the mesa 1330 or continuously around the mesa 1330. As a further example, one or more of the groove 1328 may be formed per side of the mesa 1330. In another example, the groove 1328 may include any design or shape, such as circular, triangular, or rectangular, for example. In yet another example, the depth of the groove 1328 is not to be limited to the height of the mesa 1330 and may include any depth that helps to minimize electrical shorting occurrences.

The inner leads 1204 can have an inner peripheral side 1316 that is non-linear. The inner peripheral side 1316 that is non-linear can be the side of the inner leads 1204 facing away for the first device. As an example, the inner peripheral side 1316 is shown having a curved contour.

The inner leads 1204 can have an inner half-etched portion 1318. The inner half-etched portion 1318 can be formed along an inner bottom side 1320 of the inner leads 1204. The inner half-etched portion 1318 can extend from the inner peripheral side 1316. The inner half-etched portion 1318 can extend away from the side of the inner leads 1204 facing the first device 1208, as depicted by the dashed lines.

The inner half-etched portion 1318 can be formed in a number of different ways. For example, the inner half-etched portion 1318 can be formed by a process, such as chemical etching or mechanical grinding.

The outer leads 1206 can have an outer top side 1322. The wire bond contacts 1312 can be over the outer top side 1322.

For illustrative purposes, the integrated circuit packaging system 1200 is shown with the outer leads 1206 having a height that is greater than that of the inner leads 1204, although it is understood that the outer leads 1206 can have a different height relative to that of the inner leads 1204. For example, the outer leads 1206 can have a height that is equivalent to that of the inner leads 1204. More specifically, the outer top side 1322 of the outer leads 1206 and the inner top side 1314 of the inner leads 1204 can be co-planar.

The outer leads can have an outer peripheral side 1332 that is non-linear. The outer peripheral side 1332 can be the side of the outer leads 1206 that is facing the first device 1208. As an example, the outer peripheral side 1332 is shown having a curved contour.

A second device 1334, which is a semiconductor device with active circuitry fabricated thereon, can be over the inner leads 1204 and the outer leads 1206. As an example, the second device 1334 can be an integrated circuit, a flip chip, or an integrated circuit die. The second device 1334 can be connected to the mesa 1330 of the bump contact 1326 with a bump bond 1336, which is an electrical connector. As an example, the bump bond 1136 can be a solder ball, solder post, a conductive bump or a conductive post.

A third device 1338, which is a semiconductor device having active circuitry fabricated thereon, can be mounted over the second device 1334. As an example, the third device 1338 can be an integrated circuit, a flip chip, or an integrated circuit die. The wire bonds 1210 can connect the third device 1338 and the wire bond contacts 1312 along the outer top side 1322 of the outer leads 1206.

An inter-device structure 1340 may separate the second device 1334 and the third device 1338. The inter-device structure 1340 may include an adhesive with or without thermally conducting capabilities, a spacer, an electromagnetic interference shield for blocking potentially disruptive energy fields, or a combination thereof. For example, if the inter-device structure 1340 is an adhesive layer, the adhesive layer may include a film or a partially unconsolidated (e.g.—a liquid or a gel) adhesive material, which allows the third device 1338 to self-align over the second device 1334. Furthermore, if the inter-device structure 1340 is an adhesive layer, the adhesive layer can be deposited in any pattern or shape (e.g.—a zero fillet configuration), which facilitates the adhesion of the third device 1338 to the second device 1334.

An encapsulation material 1302, which is a package cover that can be made out of an epoxy molding compound, can be over the first device 1208, the inner leads 1204 and the outer leads 1206. The encapsulation material 1302 can cover the second device 1334, the third device 1338, the wire bonds 1210 and the bump bond 1336. The inner leads 1204, the outer leads 1206 and the first device 1208 can be exposed from the encapsulation material 1302 along the inner bottom side 1320, an outer bottom side 1342 and a first bottom side 1344 of the first device 1208, respectively.

The encapsulation material 1302 can surround the length of the inner leads 1204 with the inner half-etched portion 1318. The inner half-etched portion 1318 can form a mold interlock feature with the encapsulation material. The mold interlock can function to lock the inner leads 1204 in place and mitigate or eliminate delamination.

Figure 14:
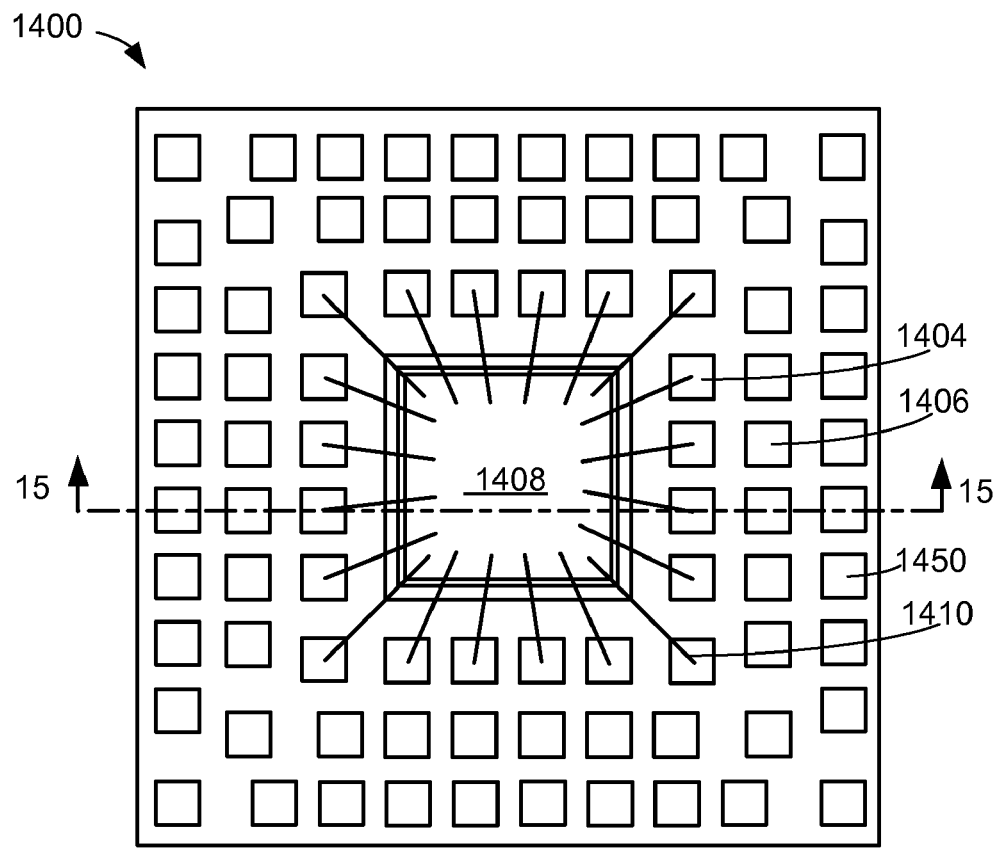
FIG. 14 is a top plan view of an integrated circuit packaging system in a fourth embodiment of the present invention.

Referring now to FIG. 14, therein is shown a top plan view of an integrated circuit packaging system 1400 in a fourth embodiment of the present invention. The top plan view depicts rows of inner leads 1404, outer leads 1406 and perimeter leads 1450, which are conductive structures that are conductive structures made from copper, a copper alloy, or other conductive material.

The inner leads 1404 can be adjacent to and around a first device 1408, which is a semiconductor device with active circuitry fabricated thereon. As an example, the first device 1408 can be an integrated circuit die, a thin integrated circuit die, an ultra thin integrated circuit die, or a flip chip. The first device 1408 can be connected to the inner leads 1404 with wire bonds 1410, which are electrical connectors, such as bond wires or ribbon bond wires.

The outer leads 1406 can be adjacent to the inner leads 1404. The outer leads 1406 can be located along the side of the inner leads 1404 opposite the first device 1408. The outer leads 1406 can be between the inner leads 1404 and the perimeter leads 1450.

The perimeter leads 1450 can be along vertical edges of the integrated circuit packaging system 1400. The perimeter leads 1450, can be adjacent to the outer leads 1406. The perimeter leads 1450 can be located along the side of the outer leads 1406 opposite the inner leads 1404.

Figure 15:
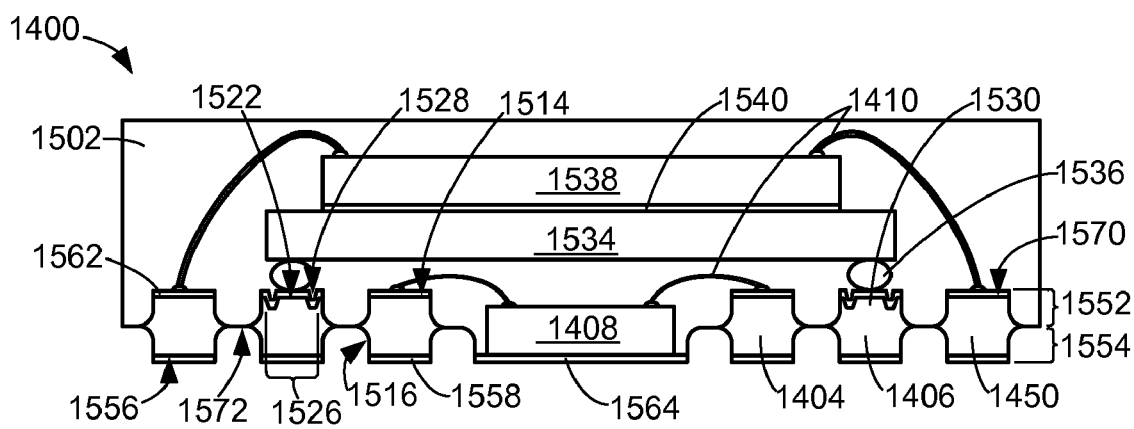
FIG. 15 is a cross-sectional view of the integrated circuit packaging system along line 15-15 of FIG. 14.

Referring now to FIG. 15, therein is shown a cross-sectional view of the integrated circuit packaging system 1400 along line 15-15 of FIG. 14. The cross-sectional view depicts the inner leads 1404, outer leads 1406 and the perimeter leads 1450 each having an upper portion 1552 and a lower portion 1554.

The lower portion 1554 of the inner leads 1404, the outer leads 1406, and the perimeter leads 1450 can have a bottom side 1556. The bottom side 1556 of the inner leads 1404, the outer leads 1406, and the perimeter leads 1450 can be co-planar with each other.

A bottom plating 1558, which is a conductive plating that can be made of conductive materials such as silver, gold, nickel-palladium alloy, or other alloys, can be along the bottom side 1556 the of the inner leads 1404, the outer leads 1406, and the perimeter leads 1450. The bottom plating 1558 can be used to connect to a next system level (not shown).

The upper portion 1552 of the inner leads 1404 can have an inner top side 1514. The inner top side 1514 can be along the upper portion 1552 that is on the side opposite the bottom side 1556 of the inner leads 1404. A top plating 1562, which is a conductive plating that can be made of conductive materials such as silver, gold, nickel-palladium alloy, can be along the inner top side 1514. The first device 1408 can be connected to the top plating 1562 of the inner leads 1404 with the wire bonds 1410.

The first device 1408 can be mounted over a die plate 1564, which is a conductive plate made from conductive materials such as silver, gold, nickel-palladium alloy, or other alloys. The die plate 1564 can be co-planar with the bottom plating 1558 of the inner leads 1404, the outer leads 1406 and the perimeter leads 1450.

The inner leads 1404 can have an inner peripheral side 1516 that is non-linear. The inner peripheral side 1516 can be the side of the inner leads 1404 facing away from the first device 1408. The inner peripheral side 1516 can be along the lower portion 1554 of the inner leads 1404. As an example, the inner peripheral side 1516 is shown having a curved contour.

The outer leads 1406 can be adjacent to the inner leads 1404. The outer leads 1406 can be located along the side of the inner leads 1404 that is facing away from the first device 1408. The inner leads 1404 can be between the outer leads 1406 and the first device 1408.

The upper portion 1552 of the outer leads 1406 can have an outer top side 1522. The outer top side 1522 can be along the upper portion 1552 that is on the side opposite the bottom side 1556 of the outer leads 1406.

A bump contact 1526 can be along the outer top side 1522 of the outer lead 1406. The bump contact 1526 can include a groove 1528 formed adjacent a mesa 1530. The mesa 1530 can be defined by the groove 1528, as the depth of the groove 1528 is substantially equal to the height of the mesa 1530.

For illustrative purposes, the integrated circuit packaging system 1400 is shown having the groove 1528 formed on opposing sides of the mesa 1530, although it is understood that the groove 1528 can be formed differently. For example, the groove 1528 can be formed on one or more sides of the mesa 1530 or continuously around the mesa 1530. As a further example, one or more of the groove 1528 may be formed per side of the mesa 1530. In another example, the groove 1528 may include any design or shape, such as circular, triangular, or rectangular, for example. In yet another example, the depth of the groove 1528 is not to be limited to the height of the mesa 1530 and may include any depth that helps to minimize electrical shorting occurrences.

A second device 1534, which is a semiconductor device with active circuitry fabricated thereon, can be over the first device 1408, the inner leads 1404, and the outer leads 1406. As an example, the second device 1534 can be an integrated circuit die, a thin integrated circuit die, an ultra thin integrated circuit die, or a flip chip.

The second device 1534 can be connected to the mesa 1530 of the bump contact 1526 with a bump bond 1536. The bump bond 1536 is an electrical interconnect, such as a solder ball, a solder post, a conductive bump, or a conductive post.

The perimeter leads 1450 can be adjacent to the outer leads 1406. The perimeter leads 1450 can be located along the side of the outer leads 1406 that is facing away from the inner leads 1404. The outer leads 1406 can be between the inner leads 1404 and the perimeter leads 1450.

The upper portion 1552 of the perimeter leads 1450 can have a perimeter top side 1570. The perimeter top side can be along the upper portion 1552 that is on the side opposite the bottom side 1556 of the perimeter leads 1450. The top plating 1562 can be along the perimeter top side 1570.

For illustrative purposes, the upper portion 1552 of the perimeter leads 1450 is shown having substantially the same dimensions as the upper portion 1552 of the inner leads 1404 and outer leads 1406, although it is understood that that the upper portion 1552 of the perimeter leads 1450 can have different dimensions. For example, the upper portion 1552 of the perimeter leads 1450 can have a height that is greater than the height of the upper portion 1552 of the inner leads 1404 and the outer leads 1406.

A third device 1538, which is a semiconductor device with active circuitry fabricated thereon, can be mounted over the second device 1534. As an example, the third device 1538 can be an integrated circuit die, a thin integrated circuit die, an ultra thin integrated circuit die, or a flip chip. The third device 1538 can be connected to the top plating 1562 of the perimeter leads 1450 with the wire bonds 1410.

An inter-device structure 1540 may separate the second device 1534 and the third device 1538. The inter-device structure 1540 may include an adhesive with or without thermally conducting capabilities, a spacer, an electromagnetic interference shield for blocking potentially disruptive energy fields, or a combination thereof. For example, if the inter-device structure 1540 is an adhesive layer, the adhesive layer may include a film or a partially unconsolidated (e.g.—a liquid or a gel) adhesive material, which allows the third device 1538 to self-align over the second device 1534. Furthermore, if the inter-device structure 1540 is an adhesive layer, the adhesive layer can be deposited in any pattern or shape (e.g.—a zero fillet configuration), which facilitates the adhesion of the third device 1538 to the second device 1534.

An encapsulation material 1502, which is a package cover that can be made out of an epoxy molding compound, can be over the inner leads 1404, the outer leads 1406, the perimeter leads 1450, and the die plate 1564. The encapsulation material 1502 can cover the first device 1408, the second device 1534, the third device 1538, the bump bond 1536, and the wire bonds 1410. The encapsulation material 1502 can be formed with the lower portion 1554 of the inner leads 1404, the outer leads 1406, and the perimeter leads 1450 can extend from the encapsulation material 1502 along an encapsulation bottom surface 1572.

Figure 16:
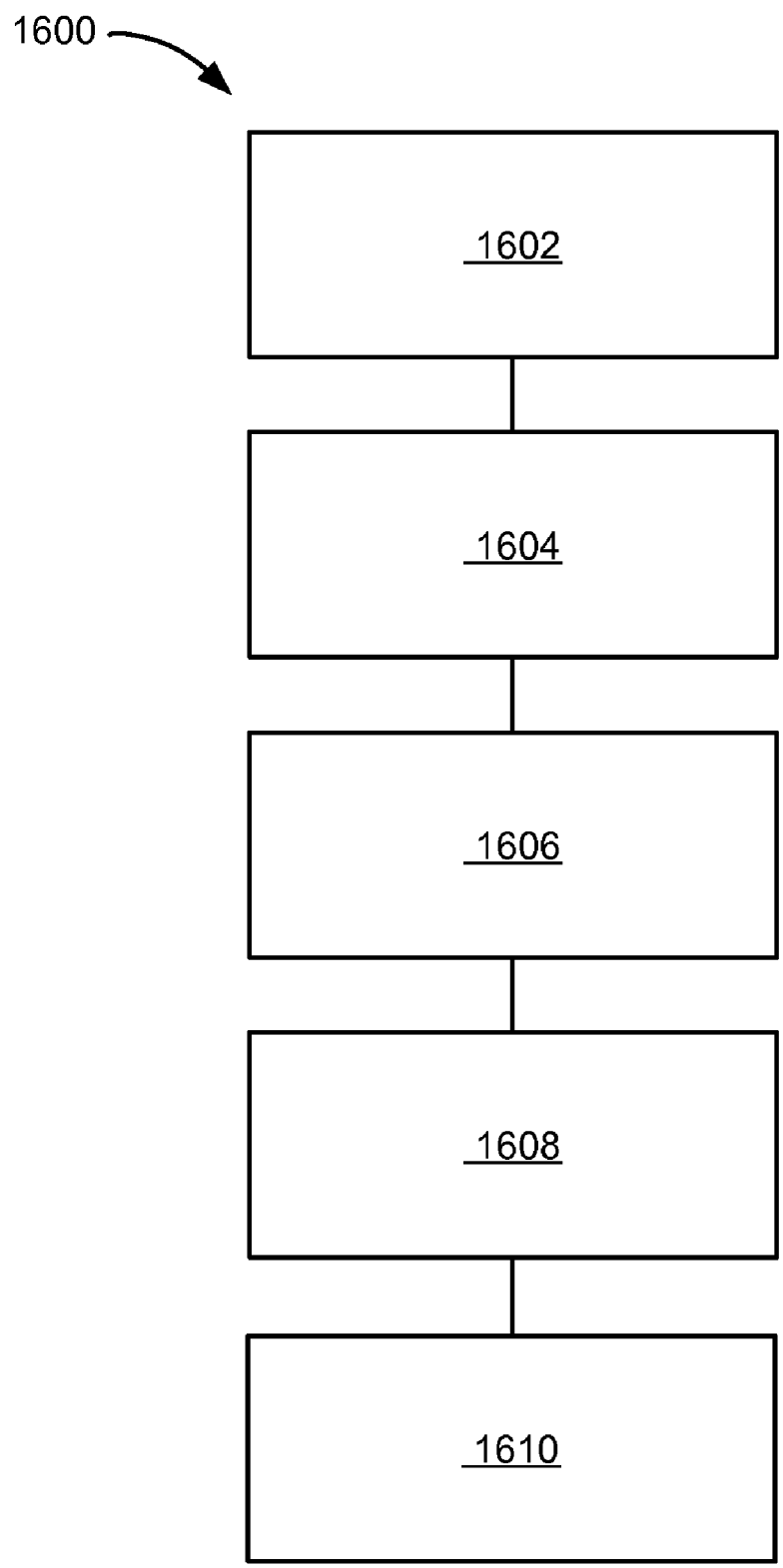
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: providing an inner lead and an outer lead, the inner lead having an inner peripheral side with a non-linear contour in a block 1602; forming a bump contact, having a groove in and a mesa from the inner lead or the outer lead, the groove adjacent to the mesa in a block 1604; mounting a first device adjacent to the inner lead in a block 1606; connecting a second device to the mesa in a block 1608; and forming an encapsulation material over the first device, the inner lead, and the outer lead and covering the second device in a block 1610.

It has been discovered that the present invention thus has numerous aspects. One such aspect is that the present invention provides a simplified device stacking process within a reduced profile package. The present invention achieves this through a combination of wire bonding, bump bonding, lead half-etching, and by forming a device within an opening of the electrical interconnect system.

Another aspect of the present invention is that it provides a reduced profile package with enhanced circuit density while employing a single electrical interconnect level system. The present invention achieves this by stacking three separate devices between and over a single electrical interconnect system.

Another aspect of the present invention is that it enhances the thermal dissipation ability of an integrated circuit package system. The present invention achieves this by exposing a device backside to an external environment for improved thermal dissipation.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for enhancing circuit density within the same interconnect level. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
    providing an inner lead and an outer lead, the inner lead having an inner peripheral side with a non-linear contour;
    forming a bump contact, having a groove in and a mesa from the inner lead or the outer lead, the groove adjacent to the mesa;
    mounting a first device adjacent to the inner lead;
    connecting a second device to the mesa; and
    forming an encapsulation material over the first device, the inner lead, and the outer lead and covering the second device.

2. The method as claimed in claim 1 wherein providing the inner lead includes providing the inner lead having an inner half etched portion along an inner bottom side of the inner lead and extending from the inner peripheral side of the inner lead.

3. The method as claimed in claim 1 further comprising:
    mounting a third device over the second device;
    connecting the third device to the outer lead; and
    wherein:
    forming the bump contact includes forming the bump contact from the outer lead.

4. The method as claimed in claim 1 further comprising:
    mounting a third device over the second device;
    connecting the third device to the outer lead; and
    wherein:
    forming the bump contact includes forming the bump contact from the inner lead.

5. The method as claimed in claim 1 wherein:
    providing the inner lead and the outer lead includes providing the inner lead between the outer lead and the first device; and
    forming the bump contact includes forming the bump contact from the outer lead.

6. A method of manufacturing an integrated circuit packaging system comprising:

providing an inner lead and an outer lead, the inner lead having an inner peripheral side with a non-linear contour;

forming a bump contact, having a groove in and a mesa from the inner lead or the outer lead, the groove adjacent to the mesa;

mounting a first device adjacent to the inner lead;

connecting a second device to the mesa;

mounting a third device over the second device with an inter device structure in between; and forming an encapsulation material over the first device, the inner lead, and the outer lead and covering the second device and the third device.

7. The method as claimed in claim 6 wherein:

providing the outer lead includes providing the outer lead having an upper top side and a lower top side, the lower top side at a lower position of the outer lead than the upper top side; and forming the bump contact includes forming the bump contact from the lower top side.

8. The method as claimed in claim 6 wherein:

providing the inner lead and the outer lead includes providing the inner lead having an inner top side of the inner lead and an outer top side of the outer lead, the inner top side co-planar with the outer top side; and forming the bump contact includes forming the bump contact from the inner top side.

9. The method as claimed in claim 6 further comprising:

providing a perimeter lead adjacent to and on a side of the outer lead facing away from the inner lead; and connecting the third device and the perimeter lead.

10. The method as claimed in claim 6 wherein forming the encapsulation material includes forming the encapsulation material with a lower portion of the inner lead and the outer lead extending from the encapsulation material.

11. An integrated circuit packaging system comprising:

a first device;

an outer lead around the first device;

an inner lead, having an inner peripheral side with a non-linear contour, adjacent to the first device;

a bump contact, having a groove in and a mesa from the inner lead or the outer lead, the groove adjacent to the mesa;

a second device connected to the mesa; and an encapsulation material over the first device, the inner lead, and the outer lead and covering the second device.

12. The system as claimed in claim 11 wherein the inner lead includes an inner half etched portion along an inner bottom side of the inner lead and extending from the inner peripheral side of the inner lead.

13. The system as claimed in claim 11 further comprising:

a third device over the second device and connected to the outer lead; and wherein:

the bump contact is along the outer lead.

14. The system as claimed in claim 11 further comprising:

a third device over the second device and to the outer lead; and wherein:

the bump contact along the inner lead.

15. The system as claimed in claim 11 wherein:

the inner lead is between the outer lead and the first device; and the bump contact is along the outer lead.

16. The system as claimed in claim 11 further comprising:

a third device over the second device with an inter device structure in between;

wherein:

the first device is connected to the inner lead; and the encapsulation material covers the third device.

17. The system as claimed in claim 11 wherein:

the outer lead has an upper top side and a lower top side, the lower top side at a lower position of the outer lead than the upper top side; and the bump contact is along the lower top side.

18. The system as claimed in claim 11 wherein:

the inner lead has an inner top side;

the outer lead has an outer top side co-planar with the inner top side; and the bump contact is along the inner top side.

19. The system as claimed in claim 11 further comprising:

a perimeter lead adjacent to and on a side of the outer lead facing away from the inner lead; and wherein:

the third device is connecting to the perimeter lead.

20. The system as claimed in claim 11 wherein a lower portion of the inner lead and the outer lead extends from the encapsulation material.

\* \* \* \* \*